United States Patent
Chao et al.

(10) Patent No.: US 8,183,766 B2
(45) Date of Patent: May 22, 2012

(54) PIXEL STRUCTURE OF ORGANIC ELECTROLUMINESCENT DISPLAY PANEL AND METHOD OF MAKING THE SAME

(75) Inventors: Ching-Yan Chao, Hsin-Chu (TW); Hsia-Tsai Hsiao, Hsin-Chu (TW); Hsieh-Hsin Yeh, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 106 days.

(21) Appl. No.: 12/834,028

(22) Filed: Jul. 12, 2010

(65) Prior Publication Data

US 2010/0277403 A1  Nov. 4, 2010

Related U.S. Application Data

(63) Continuation-in-part of application No. 11/755,729, filed on May 30, 2007, now abandoned.

(30) Foreign Application Priority Data

Mar. 7, 2007 (TW) .................... 96107914 A

(51) Int. Cl.
H01L 51/50 (2006.01)
H01L 51/52 (2006.01)
H01L 51/56 (2006.01)

(52) U.S. Cl. ........ 313/505; 313/500; 313/503; 313/506; 315/169.3; 445/24; 427/66

(58) Field of Classification Search .......... 313/500–512; 315/169.1–169.4; 345/44–46, 76–81; 445/24, 445/25; 427/66
See application file for complete search history.

(56) References Cited

U.S. PATENT DOCUMENTS

| | | | |
|---|---|---|---|
| 6,107,734 | A | 8/2000 | Tanaka |
| 6,407,408 | B1 | 6/2002 | Zhou |
| 6,515,428 | B1 | 2/2003 | Yeh |
| 6,583,776 | B2 | 6/2003 | Yamazaki |
| 6,693,296 | B1 | 2/2004 | Tyan |
| 7,214,960 | B2 * | 5/2007 | Sano ............................. 257/89 |
| 7,511,422 | B2 | 3/2009 | Kato |
| 2004/0079945 | A1 | 4/2004 | Weaver |
| 2005/0174064 | A1 | 8/2005 | Agostinelli |
| 2006/0001033 | A1 | 1/2006 | Tsujimura |
| 2006/0108914 | A1* | 5/2006 | Young ........................... 313/503 |
| 2006/0220544 | A1 | 10/2006 | Okuyama |
| 2007/0159085 | A1 | 7/2007 | Kuma |
| 2009/0242910 | A1* | 10/2009 | Murofushi et al. ............ 257/88 |
| 2011/0037054 | A1* | 2/2011 | Shieh et al. .......... 257/E51.022 |

FOREIGN PATENT DOCUMENTS

| | | |
|---|---|---|
| CN | 1713791 A | 12/2005 |
| EP | 1 648 032 | 4/2006 |
| JP | 2000173771 | 6/2000 |
| JP | 2002313572 A * | 10/2002 |
| TW | 200601210 | 1/2006 |
| TW | 200611601 | 4/2006 |
| TW | I256858 | 6/2006 |

* cited by examiner

*Primary Examiner* — Mariceli Santiago
(74) *Attorney, Agent, or Firm* — Winston Hsu; Scott Margo

(57) ABSTRACT

A pixel structure of an organic electroluminescent display panel has a plurality of sub-pixel regions. Each of the sub-pixel regions has a plurality of organic luminescent devices electrically connected in series, and the organic luminescent devices disposed in a same sub-pixel region are disposed between a source electrode of a thin film transistor and a voltage source Vdd.

28 Claims, 13 Drawing Sheets

PIXEL STRUCTURE OF ORGANIC ELECTROLUMINESCENT DISPLAY PANEL AND METHOD OF MAKING THE SAME

CROSS REFERENCE TO RELATED APPLICATIONS

This application is a continuation in part of U.S. application Ser. No. 11/755,729, filed May 30, 2007.

BACKGROUND OF THE INVENTION

1. Field of the Invention

The present invention relates to a pixel structure of an organic electroluminescent display panel and a method of making the same, and more particularly, to a pixel structure having a plurality of luminescent devices connected in series in sub-pixel regions and a method of making the same.

2. Description of the Prior Art

Organic electroluminescent displays, such as organic light emitting diode (OLED) displays, have advantages of small size, high resolution, high contrast ratio, low power consumption, and active luminescence, which put the organic electroluminescent displays in position to surpass liquid crystal displays as the next generation flat panel display technology. Please refer to FIG. 1 and FIG. 2. FIG. 1 is a schematic diagram illustrating a structure of a single luminescent device of a conventional organic electroluminescent display panel, and FIG. 2 is a schematic diagram illustrating a driving circuit structure of a pixel structure of a conventional organic electroluminescent active-matrix display panel. As shown in FIG. 1, a luminescent device of the conventional electroluminescent display panel includes a substrate 10 and an anode 12, a hole injection layer 14, a hole transport layer 16, an organic luminescent layer 18, an electron transport layer 20 and a cathode 22, which are disposed on the substrate 10 in that order. The stacked structure described above is a commonly-used structure in the formation of luminescent devices, and luminescent devices utilizing the above-mentioned stacked structure are generally called "normal-type" luminescent devices. Fabrication of the normal-type luminescent device is a mature technology, and has advantages of high yield and high reliability.

Early pixel structures employing the normal-type luminescent device have the following shortcomings when operating with a-Si TFTs produced in an amorphous Si process. As shown in FIG. 2, a driving circuit of the pixel structure employing the normal-type luminescent device includes two thin film transistors T1, T2 and a capacitor C. The thin film transistors T1, T2 can be NMOS thin film transistors. The gate electrode of the thin film transistor T1 is connected to a scan line, and a source electrode and a drain electrode are respectively connected to a data line and a gate electrode of the thin film transistor T2. A source electrode of the thin film transistor T2 is connected to a voltage source Vdd, and a drain electrode of the thin film transistor T2 is connected to an anode 12 of the luminescent device. As shown in FIG. 2, if the NMOS produced by the normal amorphous Si process is used, and the luminescent device is located between the thin film transistor T2 and the voltage source Vss, the disposition affects the threshold voltage of the thin film transistor T2, due to increased device voltage during operation of the luminescent device, so that the current of the thin film transistor T2 becomes unstable. Therefore, in the thin film transistor process of the driving circuit, a PMOS produced by a low temperature poly-silicon (LTPS) process is used to lower the effect of the increased voltage across the luminescent device. However, the LTPS process is more complicated, and panel uniformity suffers. Development of a large substrate is not mature.

Additionally, the single-pixel structure of the conventional electroluminescent display panel only has a single luminescent device, so the driving current of the luminescent device is larger. The large current not only affects the driving stability of the thin film transistor T2, especially for the amorphous thin film transistor with low electron mobility, but also increases power consumption and generates higher thermal energy, which affects the lifetime of the luminescent device.

SUMMARY OF THE INVENTION

It is therefore an object of the present invention to provide a pixel structure of an organic electroluminescent display panel and a method of making the same.

According to the present invention, a pixel structure of an organic electroluminescent display panel is provided. The pixel structure includes a substrate, a thin film transistor, a first passivation layer, a first bottom electrode, a second bottom electrode, a second passivation layer, a partition, a first organic luminescent layer, a first top electrode, and a second top electrode. The substrate has a thin film transistor region, a first luminescent device region, and a second luminescent device region. The thin film transistor is disposed in the thin film transistor region of the substrate. The first passivation layer is disposed on the substrate, and the first passivation layer has an opening partially exposing the thin film transistor. The first bottom electrode is disposed on the first passivation layer in the first luminescent device region. The second bottom electrode is disposed on the first passivation layer in the second luminescent device region. The second passivation layer is disposed on the first bottom electrode and the second bottom electrode so as to at least partially expose the first bottom electrode and the second bottom electrode, the exposed first bottom electrode has a first luminescent region and a first series-connected region, and the exposed second bottom electrode has a second luminescent region and a second series-connected region. The partition is substantially disposed on the second passivation layer and substantially overlapped with at least one of the first series-connected region and the second series-connected region. The first organic luminescent layer is disposed on the first bottom electrode, and the second organic luminescent layer is disposed on the second bottom electrode in the second luminescent region. The first top electrode is disposed on first the organic luminescent layer in the first luminescent region and is disposed on a part of the first passivation layer in the thin film transistor region, and is electrically connected to the thin film transistor through the opening of the first passivation layer. The second top electrode is disposed on the second organic luminescent layer in the second luminescent region and electrically connected to the first series-connected region.

According to the present invention, a pixel structure of an organic electroluminescent display panel is provided. The pixel structure includes a substrate, a thin film transistor, a first passivation layer, a first bottom electrode, a second bottom electrode, a second passivation layer, a partition, a first organic luminescent layer, a first top electrode, and a second top electrode. The substrate has a thin film transistor region, a first luminescent device region, and a second luminescent device region. The thin film transistor is disposed in the thin film transistor region of the substrate. The first passivation layer is disposed on the substrate, and the first passivation layer has an opening partially exposing the thin film transistor. The first bottom electrode is disposed on the first passivation layer in the first luminescent device region. The second bottom electrode is disposed on the first passivation layer in the second luminescent device region. The second passivation layer is disposed on the first bottom electrode and the second bottom electrode so as to at least partially expose the first bottom electrode and the second bottom electrode, the exposed first bottom electrode has a first luminescent region and a first series-connected region, and the exposed second bottom electrode has a second luminescent region and a second series-connected region. The partition is substantially disposed on the second passivation layer. The first organic luminescent layer is disposed on the first bottom electrode, and the second organic luminescent layer is disposed on the second bottom electrode in the second luminescent region, wherein a portion of the first organic luminescent layer is substantially within the opening of the first passivation layer. The first top electrode is disposed on the first organic luminescent layer in the first luminescent region and is disposed on a part of the first passivation layer in the thin film transistor region, and is electrically connected to the thin film transistor through the opening of the first passivation layer. The second top electrode is disposed on the second organic luminescent layer in the second luminescent region and electrically connected to the first series-connected region.

According to the present invention, a method of making an organic electroluminescent display panel is provided. A substrate having a plurality of pixel regions and a plurality of thin film transistors respectively disposed in each of the pixel regions is provided. A first passivation layer is formed on the substrate corresponding to each of the thin film transistors, and the first passivation layer has an opening exposing at least part of each of the thin film transistors. A plurality of bottom electrodes are formed in each of the pixel regions. A second passivation layer is formed on the first passivation layer and the bottom electrodes, wherein the second passivation at least partially exposes each of the bottom electrodes to form a luminescent region and a series-connected region on each of the bottom electrodes. A plurality of partitions are formed on the second passivation layer for dividing each of the pixel regions into a plurality of sub-pixel regions, wherein each of the bottom electrodes is located in each of the corresponding sub-pixel regions, each of the partitions has a top surface, and each of the partitions substantially overlaps with one of the series-connected regions. A first evaporation process is performed to form an organic luminescent layer on the bottom electrodes and on all the top surface of each partition to form a plurality of organic luminescent patterns isolated from each other on the anodes through the partitions. Each of the organic luminescent patterns is respectively corresponding to each of the bottom electrodes, and a portion of each of the organic luminescent patterns is substantially within the opening of the first passivation. A second evaporation process is performed to form a plurality of top electrodes on the organic luminescent layer corresponding to each of the organic luminescent patterns. The top electrodes are isolated from each other on the organic luminescent patterns through the partitions to form a plurality of organic luminescent devices. In each of the pixel regions, the top electrode in one of the sub-pixel regions is in contact with the series-connected region of the adjacent bottom electrode, and the top electrode in another sub-pixel region is in contact with the adjacent thin film transistor to connect the organic luminescent devices in each of the sub-pixel regions to the thin film transistor in series.

According to the present invention, a pixel structure of an organic electroluminescent display panel is provided. The pixel structure includes a substrate, a thin film transistor, a first passivation layer, a first bottom electrode, a second bottom electrode, a second passivation layer, a partition, a first organic luminescent layer, a first top electrode, and a second top electrode. The substrate has a thin film transistor region, a first luminescent device region, and a second luminescent device region. The thin film transistor is substantially disposed in the thin film transistor region of the substrate. The first passivation layer is disposed on the substrate, and the first passivation layer has an opening partially exposing the thin film transistor. The first bottom electrode is disposed on the first passivation layer in the first luminescent device region. The second bottom electrode is disposed on the first passivation layer in the second luminescent device region. The second passivation layer is disposed on the first bottom electrode and the second bottom electrode so as to at least partially expose the first bottom electrode and the second bottom electrode. The exposed first bottom electrode has a first luminescent region and a first series-connected region, and the exposed second bottom electrode has a second luminescent region and a second series-connected region. The partition is substantially disposed on the second passivation layer and at least overlapped with a portion of the thin film transistor. The first organic luminescent layer is disposed on the first bottom electrode, and the second organic luminescent layer is disposed on the second bottom electrode in the second luminescent region. The first top electrode is disposed on the first the organic luminescent layer in the first luminescent region and disposed on a part of the first passivation layer in the thin film transistor region, and electrically connected to the thin film transistor through the opening of the first passivation layer. The second top electrode is disposed on the second organic luminescent layer in the second luminescent region, and electrically connected to the first bottom electrode under the partition.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
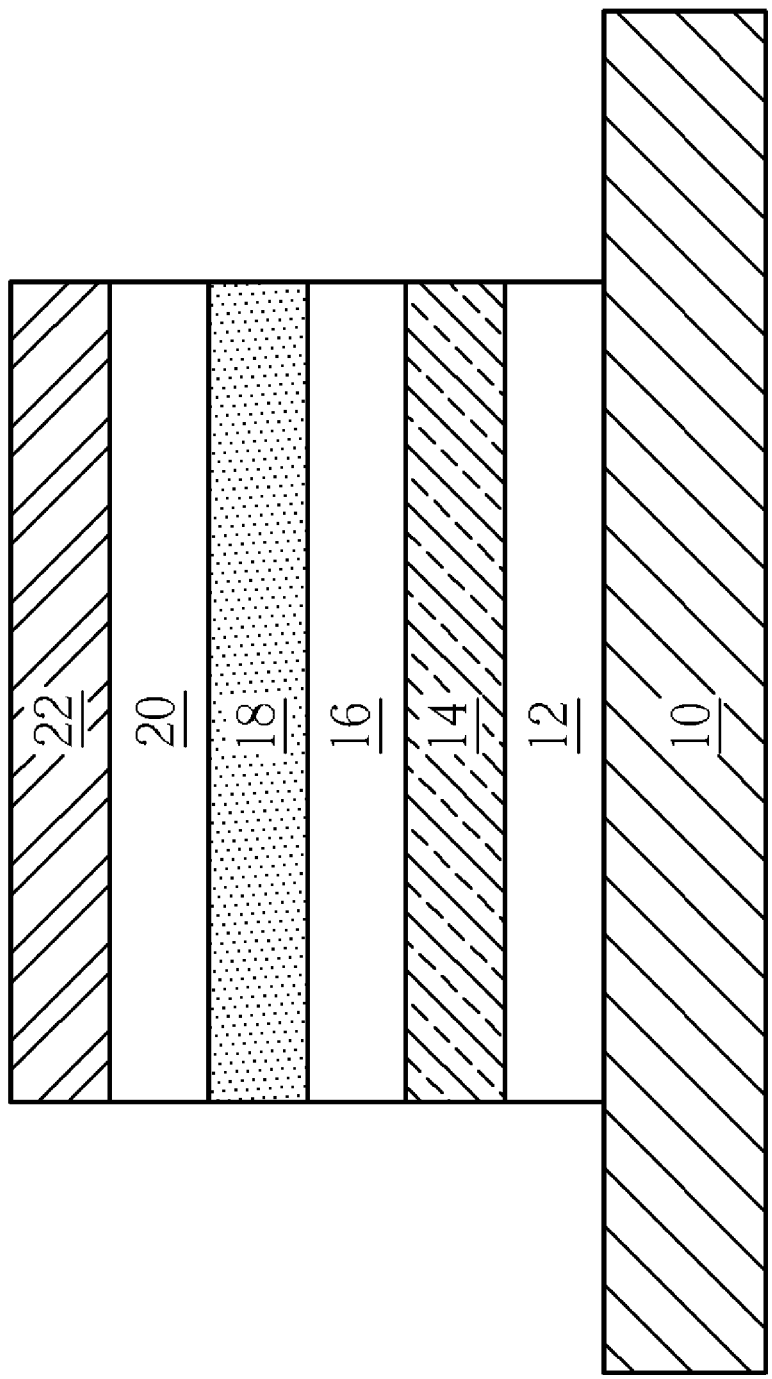
FIG. 1 is a schematic diagram illustrating a structure of a single luminescent device of a conventional organic electroluminescent display panel.
Figure 2:
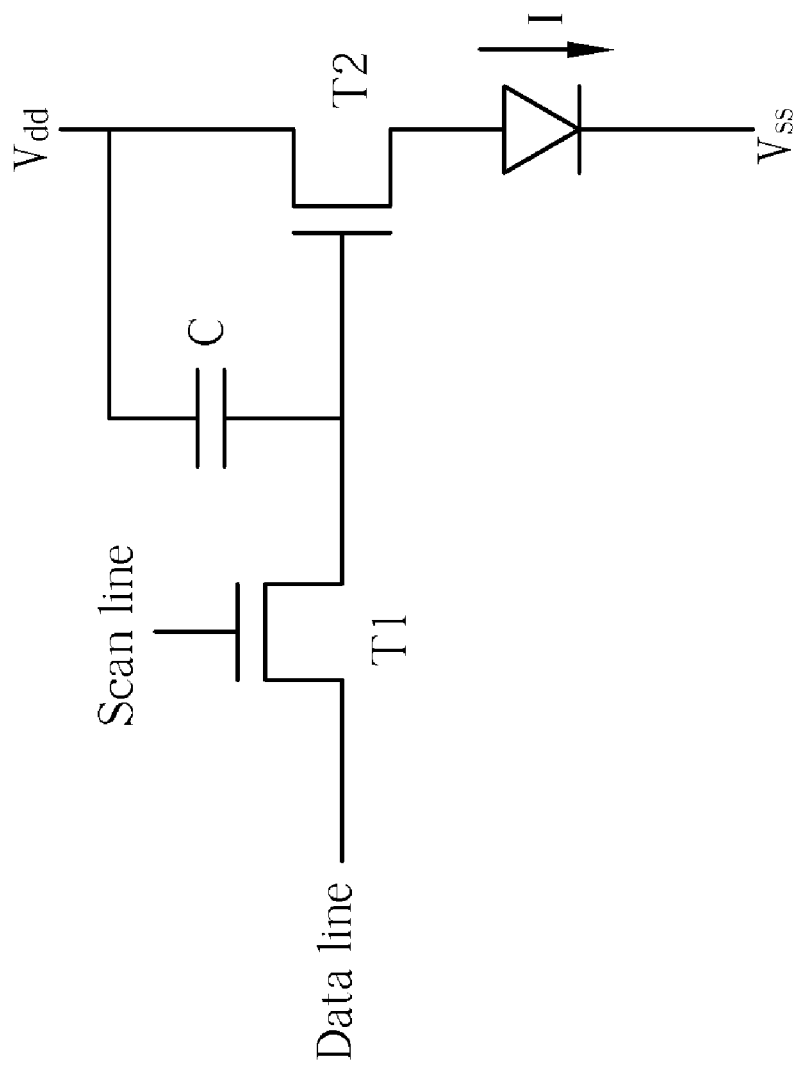
FIG. 2 is a schematic diagram illustrating a driving circuit structure of a pixel structure of a conventional organic electroluminescent active-matrix display panel.
Figure 3:
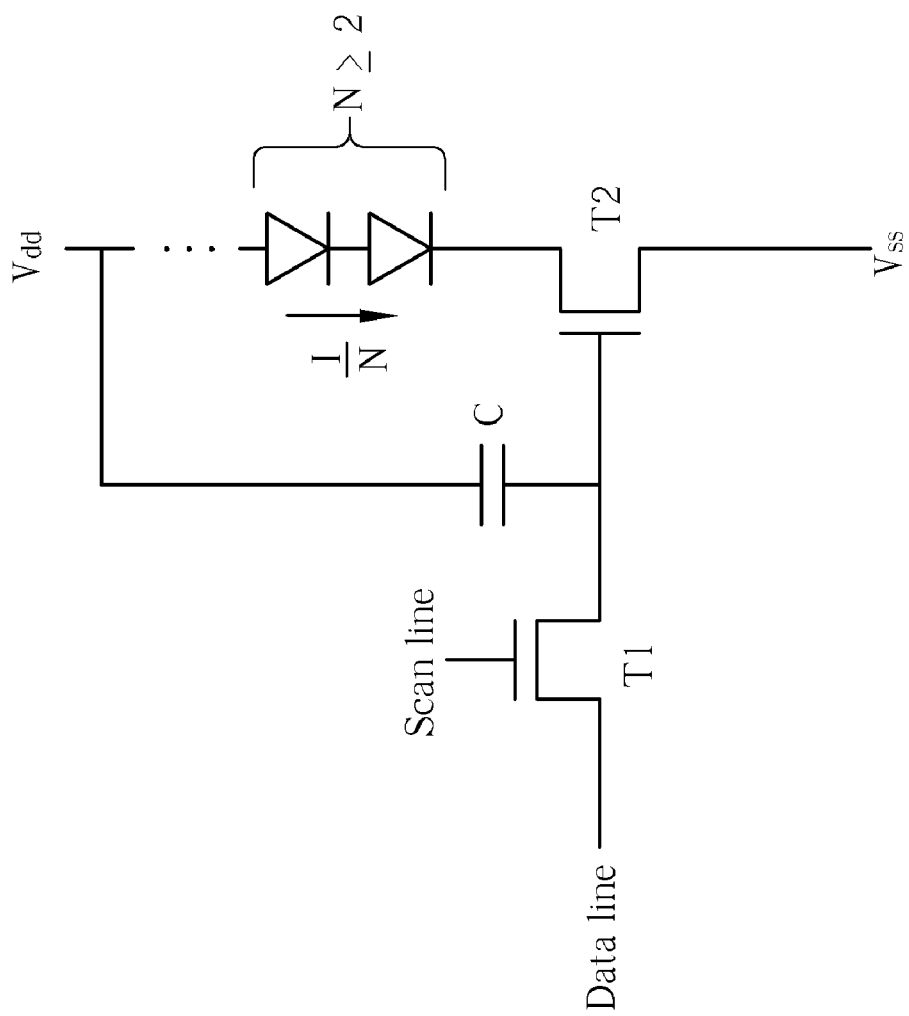
FIG. 3 is a schematic diagram illustrating a driving circuit structure of a pixel structure of an organic electroluminescent display panel according to a preferred embodiment of the present invention.

Please refer to FIG. 3. FIG. 3 is a schematic diagram illustrating a driving circuit structure of a pixel structure of an organic electroluminescent display panel according to a preferred embodiment of the present invention. As shown in FIG. 3, the driving circuit structure of the pixel structure according to this embodiment includes two thin film transistors T1, T2 and a capacitor C. The thin film transistors T1, T2 are, for instance, NMOS thin film transistors. The gate electrode of the thin film transistor T1 is connected to a scan line, and the drain electrode and the source electrode are respectively connected to a data line and the gate electrode of the thin film transistor T2. The source electrode of the thin film transistor T2 is connected to a plurality of luminescent devices, and the drain electrode of the thin film transistor T2 is connected to a voltage source Vss. The differences between the pixel structure of this embodiment and the conventional pixel structure are twofold. First, in this embodiment, the luminescent device is located between the voltage source Vdd and the drain electrode of the thin film transistor T2, so as to reduce the effect of the increased voltage across the luminescent device on the thin film transistor T2, especially for amorphous silicon thin film transistors. Therefore, the stability of the luminescent device can be increased. Second, the pixel structure of this embodiment not only has a luminescent device, but also has at least two luminescent devices connected in series. With more luminescent devices in series, the driving current required is largely reduced. For example, two series luminescent devices are used. Compared with the driving current I of the prior art luminescent device, the driving current of each of the luminescent devices in the present invention can be roughly reduced to I/2, and the brightness of the display panel is kept the constant. If the number of the luminescent devices in series is N, the driving current of each of the luminescent devices is roughly reduced to I/N. Therefore, reducing current decreases power consumption of the thin film transistor T2, and reduces the temperature of the display panel resulting from thermal energy, so that the lifetime of the luminescent device can be improved.

Figure 4:
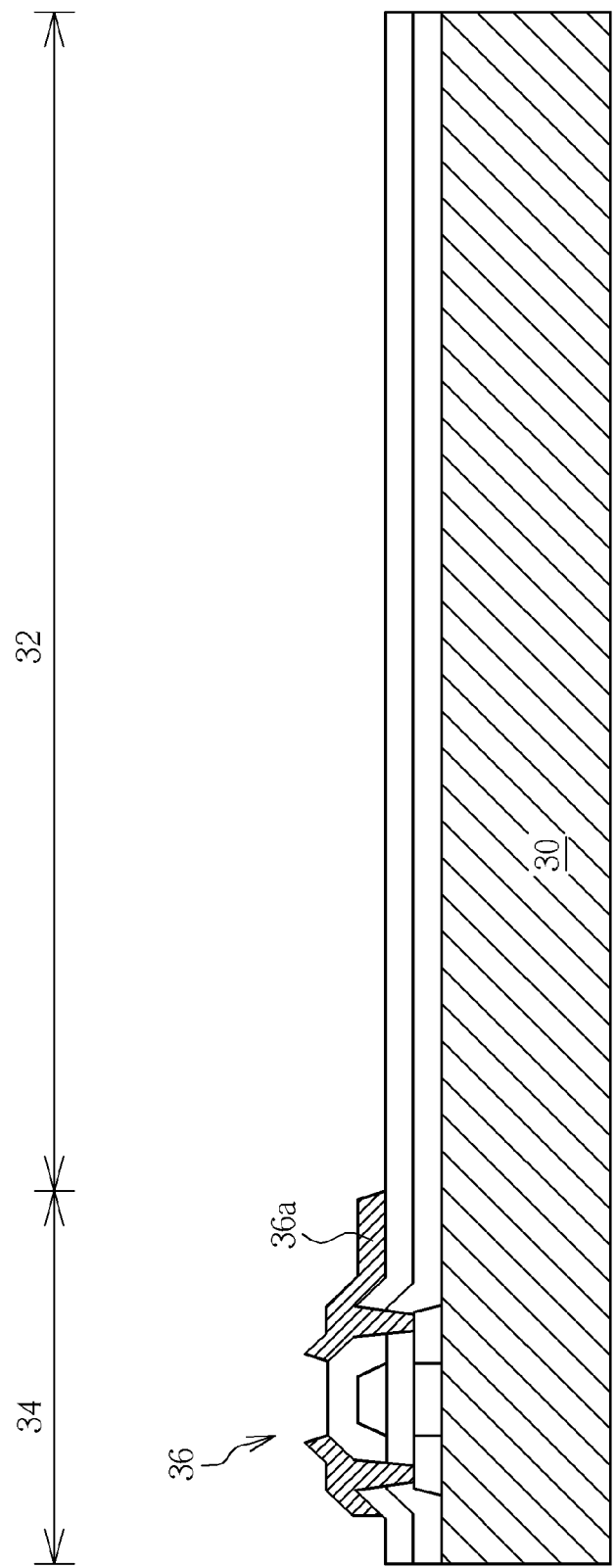
FIG. 4 through FIG. 9 are schematic diagrams illustrating a method of making an organic electroluminescent display panel and a pixel structure thereof according to a preferred embodiment of the present invention.
Figure 6:
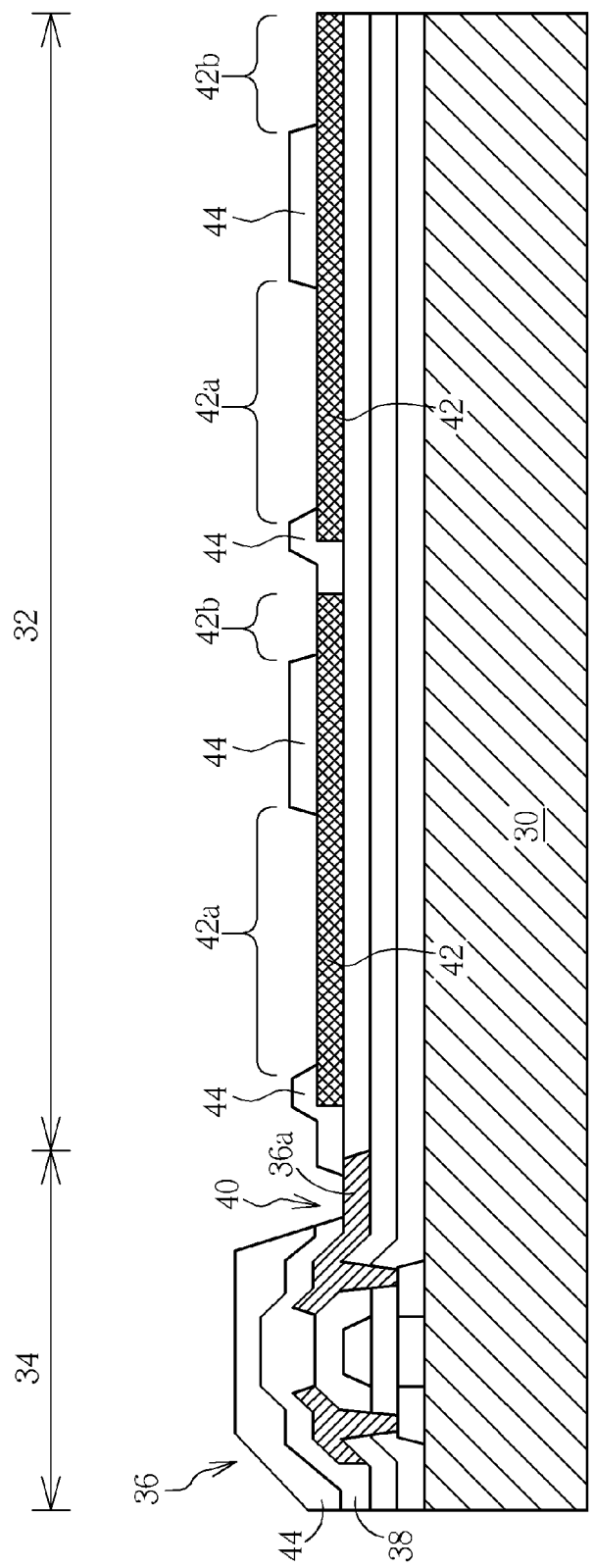
Figure 7:
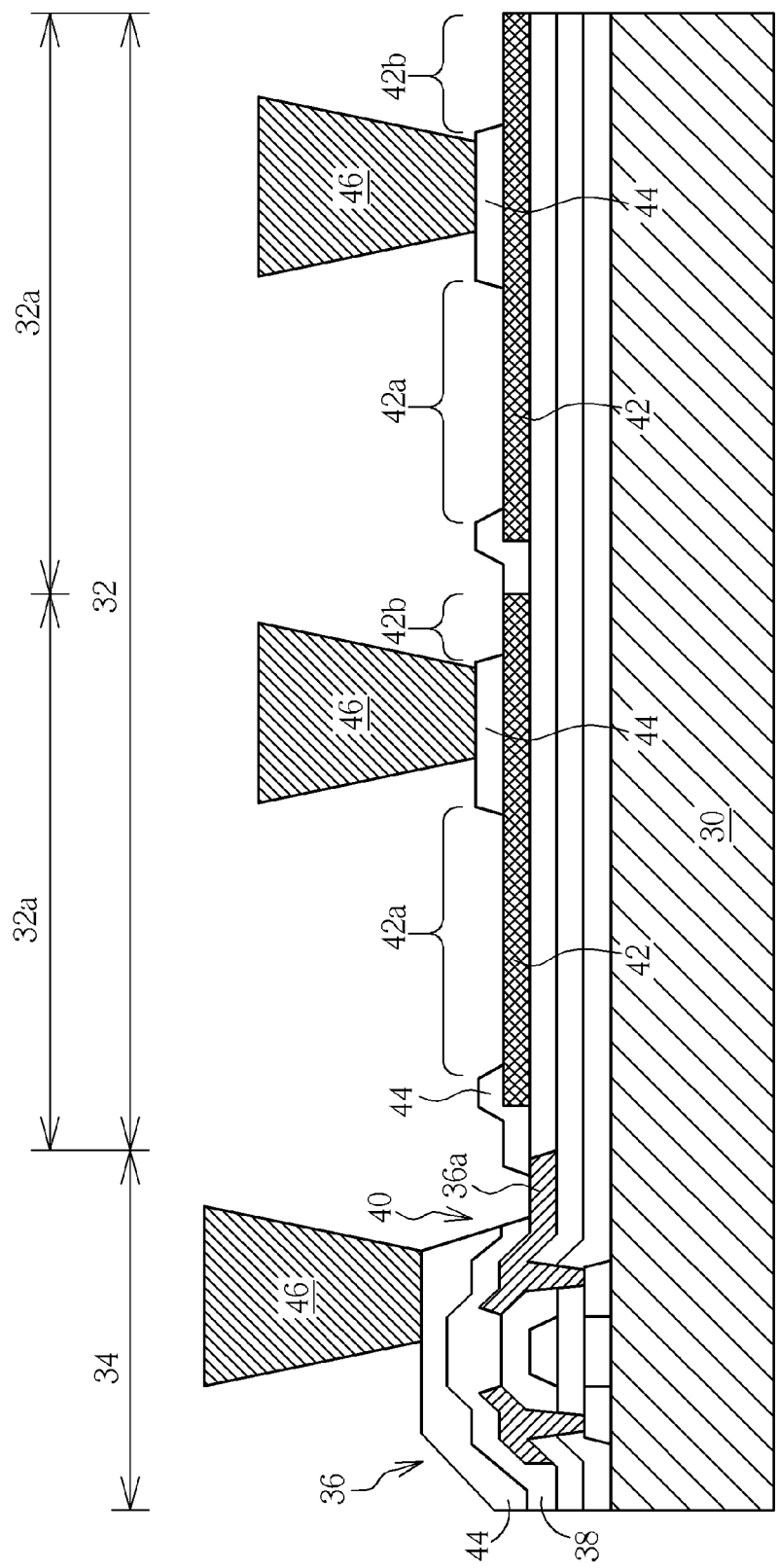
Figure 8:
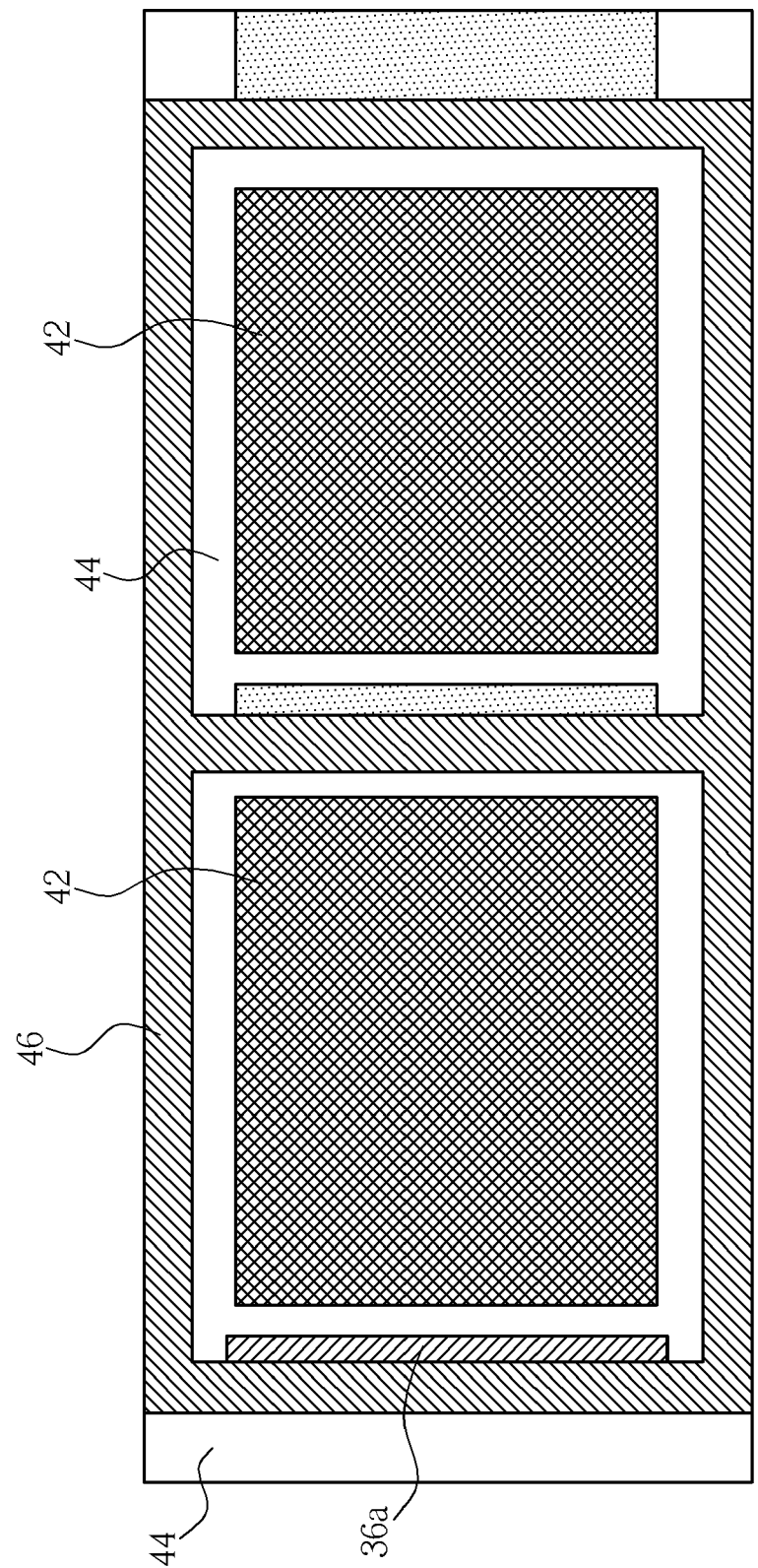

Please refer to FIG. 4 through FIG. 9. FIG. 4 through FIG. 9 are schematic diagrams illustrating a method of making the organic electroluminescent display panel and a pixel structure thereof according to a preferred embodiment of the present invention, wherein FIG. 8 is a top view of a pixel structure shown in FIG. 7. It is worthy of note that this embodiment takes an OLED display panel using amorphous silicon thin film transistors as a switching device as an example to describe the method of the present invention. The present invention is not limited to this example, and can be applied to make other types of organic electroluminescent display panels, such as organic electroluminescent display panels using thin film transistors produced by low-temperature poly-silicon or solid-phase crystalline (SPC) processes as the switching device. In addition, in order to emphasize the key point of the present invention, the figure only shows a pixel structure. As shown in FIG. 4, first, a substrate 30 is provided, such as a glass substrate, and the substrate 30 includes a plurality of pixel regions 32 and a plurality of thin film transistor regions 34. Next, a thin film transistor 36 is fabricated on the substrate 30 in each of the thin film transistor regions 34. The process used for fabricating the thin film transistor 36 is well known in the art, so the process is not described further.

Figure 5:
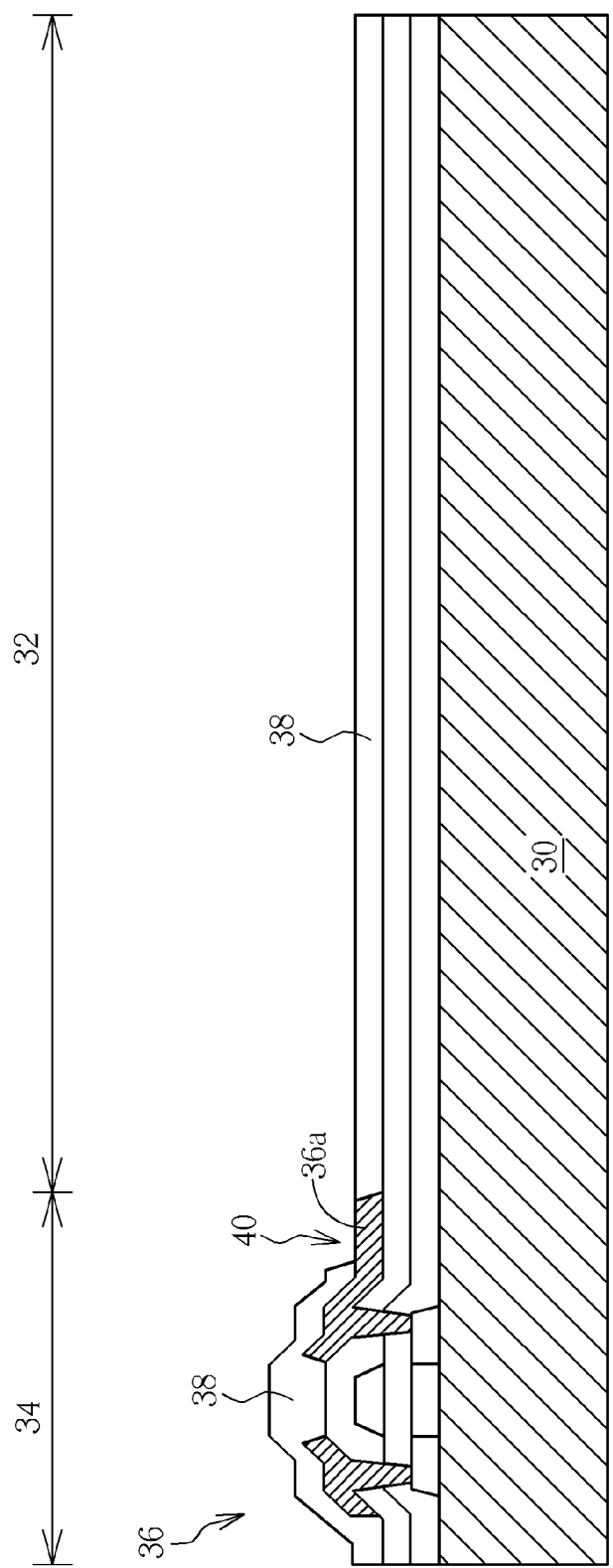

As shown in FIG. 5, a first passivation layer 38 is then formed on the substrate 30. The first passivation layer 38 forms a plurality of openings 40 respectively corresponding to each of the thin film transistors 36. Each of the openings 40 exposes the drain electrode 36a of each of the thin film transistors 36. As shown in FIG. 6, a plurality of bottom electrodes e.g. a first bottom electrode and a second bottom electrode are formed in each pixel region 32. The first bottom electrode and the second bottom electrode are, for example, anodes 42, but not limited thereto. This embodiment takes a bottom-emission type organic electroluminescent display panel as an example to describe the method of the present invention, so the material of the anodes 42 is a transparent conductive material, such as indium-tin oxide (ITO), indium-zinc oxide (IZO), aluminum-zinc oxide (AZO), or combinations thereof. The present invention can also be applied to making an organic electroluminescent display panel of the top-emission type, and the material of the anodes 42 in this situation would be metal. Subsequently, a second passivation layer 44 is formed on the first passivation layer 38 and the anodes 42. The second passivation layer 44 partially exposes at least part of each of the anodes 42 to form a luminescent region 42a e.g. a first luminescent region and a series-connected region 42b e.g. a first series-connected region on the anode 42, and another luminescent region 42a e.g. a second luminescent region, and another series-connected region 42b e.g. a second series-connected region, on another anodes 42. The series-connected region 42b on each of the anodes 42 is located between the luminescent region 42a thereof and the luminescent region 42a of the adjacent anode 42. In addition, the second passivation layer 44 does not cover the openings 40 of the first passivation layer 38.

As shown in FIG. 7 and FIG. 8, a plurality of partitions (also referred to as pillars) 46 are then formed on the second passivation layer 44. A portion of the partition 46 located above and overlapped with the thin film transistor 36 is overlapped with the opening 40. Specifically, the partition 46 substantially overlaps with at least one of the series-connected regions 42b. Each of the partitions 46 divides each of the pixel regions 32 into a plurality of sub-pixel regions 32a. Each of the anodes 42 is located in each of the corresponding sub-pixel regions 32a. In this embodiment, the top view of each of the partitions 46 shows a plurality of circular structures (as shown in FIG. 8), and the number of the circular structures is determined according to the number of the sub-pixel regions 32a divided by each of the pixel regions 32.

Figure 9:
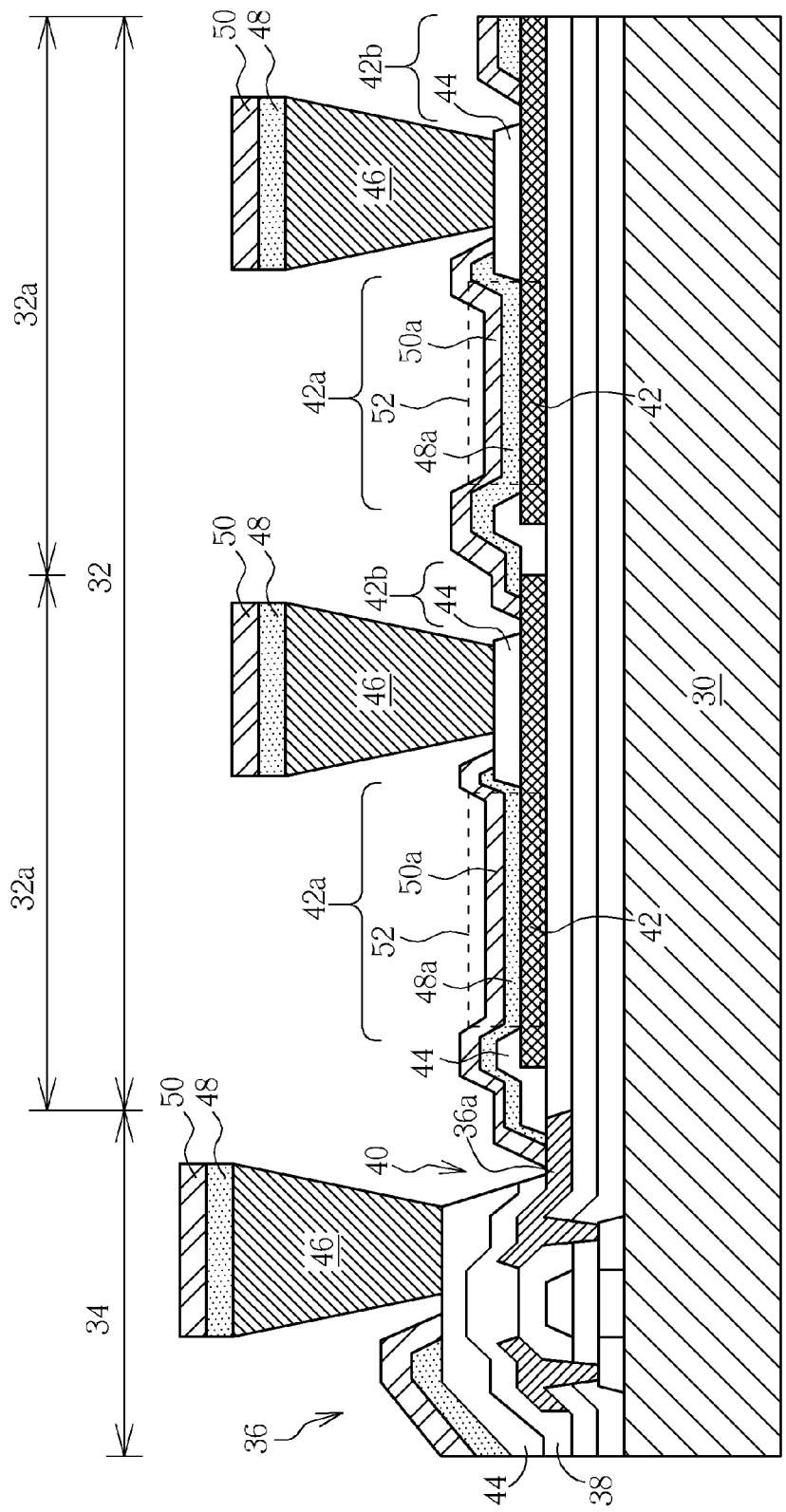

As shown in FIG. 9, an organic luminescent layer 48 is subsequently formed on the anodes 42. Specifically, a first organic luminescent layer is disposed on the first bottom electrode, and a portion of the first organic luminescent layer is substantially within the opening 40 of the first passivation layer 38; a second organic luminescent layer is disposed on the second bottom electrode in the second luminescent region. The organic luminescent layer 48 forms a plurality of organic luminescent patterns 48a on the anodes 42 which are isolated from each other through the partitions 46. Each of the organic luminescent patterns 48a respectively corresponds to each of the anodes 42. Next, a top electrode layer e.g. a cathode layer 50 but not limited thereto is formed on the organic luminescent layer 48, and similarly, the cathode layer 50 forms a plurality of top electrodes e.g. cathodes 50a on the organic luminescent patterns 48a through the partitions 46. Each of the cathodes 50a respectively corresponds to each of organic luminescent patterns 48a, so an organic luminescent device 52 is formed in each of the sub-pixel regions 32a. The organic luminescent layer 48 can comprise different organic luminescent materials depending on whether the pixel region 32 is a red pixel region, a green pixel region, or a blue pixel region. In addition, if the organic electroluminescent display panel is bottom-emission type, the material of the cathode layer 50 will comprise metal, such as aluminum, lithium, calcium, magnesium, barium, or combinations thereof. If the organic electroluminescent display panel of top-emission type is required, the material of the cathode layer 50 will comprise a transparent conductive material.

Beyond dividing each of the pixel regions 32 into a plurality of sub-pixel regions 32a, the partitions 46 of this embodiment also function to define patterns and to prevent from the contact damage of metal mask. In addition, the cathode 50a in each of the sub-pixel regions 32a can be in direct contact with the series-connected region 42b of the anode 42 in the adjacent sub-pixel region 32a. The cathode 50a in the sub-pixel region 32a adjacent to the thin film transistor 36 may be in direct contact with the drain electrode 36a of the thin film transistor 36 through the opening 40 of first passivation layer 38. Also, the cathode 50a in the another luminescent region 42a (i. e. the second luminescent region) is electrically connected to the anode 42 (i.e. the first bottom electrode) under the partition 46. Therefore, the organic luminescent devices 52 in each of the pixel regions 32 can be connected to the thin film transistor 36 in series. In addition, the cathode 50a located on the series-connected region 42b of the other side of the anode 42 corresponding to the thin film transistor 36 is electrically connected to a voltage source Vdd.

In order to improve electrical connecting of each of the organic luminescent devices 52, the partition of this embodiment has the several special characteristics. First, the vertical cross-sectional shape of the partition is trapezoidal, having an upside that is larger than a downside. And, each of the partitions has a top surface and an inclined side surface connected to the top surface. In this embodiment, the top surface and the inclined side surface form an included angle in a range of 40 degrees to 90 degrees, preferably in a range of 40 degrees to 70 degrees. In addition, each of the partitions 46 substantially covers at least part of the corresponding series-connected region 42b, and a width of each of the partitions 46 is in a range of 5 μm to 20 μm, but 10 μm is preferred, and a height of the partition 46 is in a range of 1 μm to 3 μm.

Figure 10:
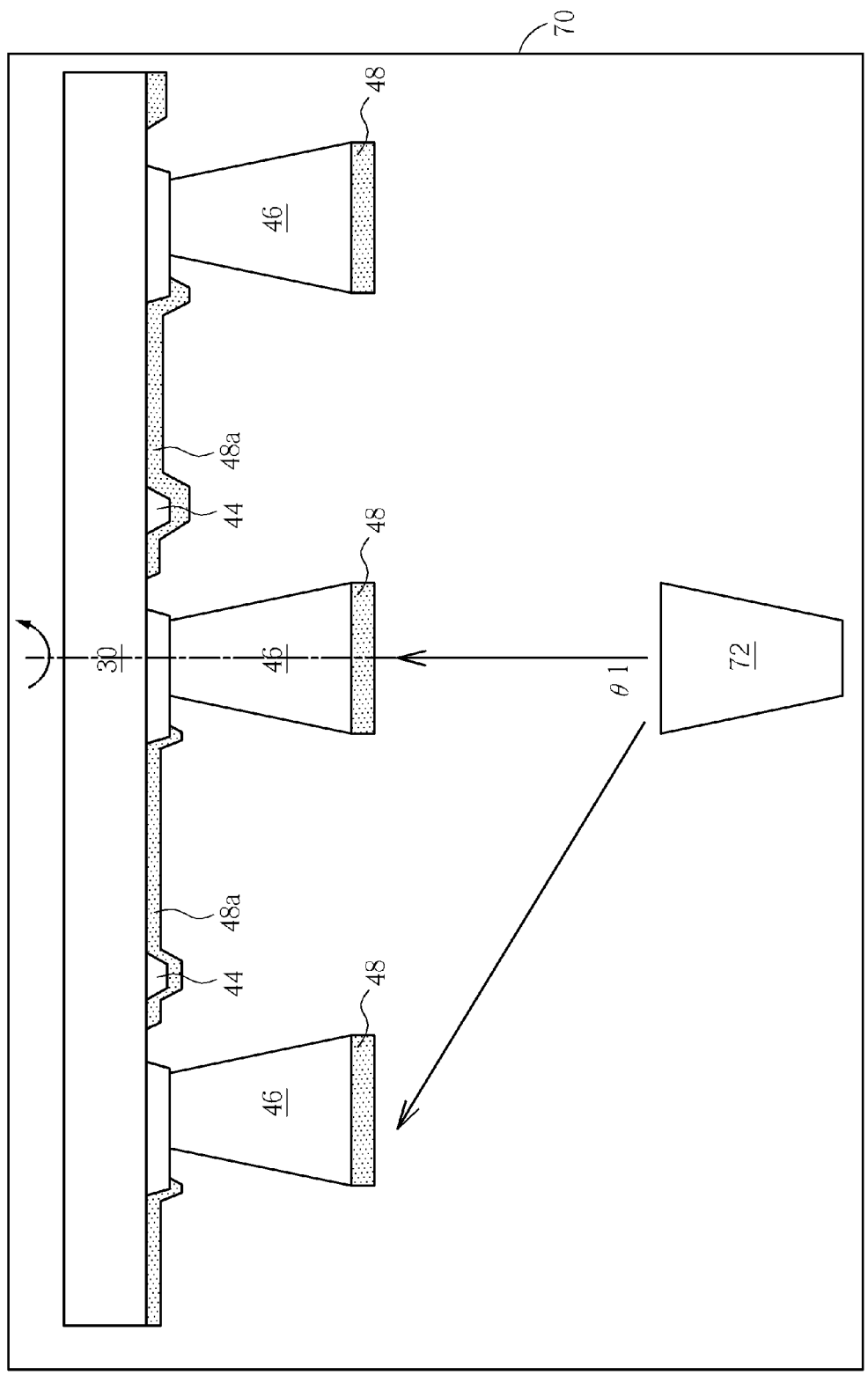
FIG. 10 is a schematic diagram illustrating a first evaporation process for forming an organic luminescent layer according to an embodiment of the present invention.
Figure 11:
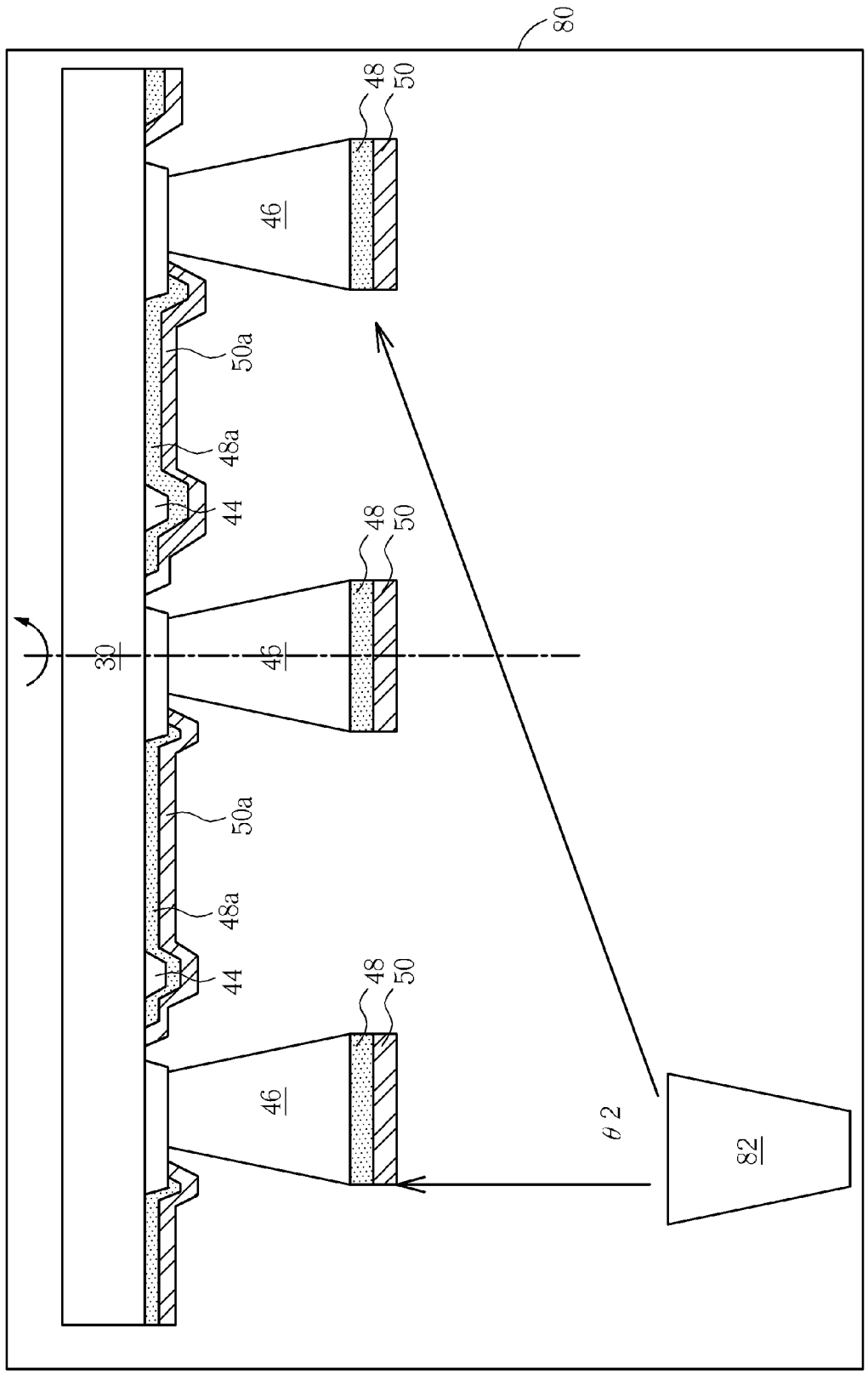
FIG. 11 is a schematic diagram illustrating a second evaporation process for forming top electrodes according to an embodiment of the present invention.

In some preferred embodiments of the present invention, the organic luminescent layer 48 and the top electrodes e.g. cathodes 50a are formed by evaporation. Please refer to FIG. 10 and FIG. 11 along with FIG. 9. FIG. 10 is a schematic diagram illustrating a first evaporation process for forming an organic luminescent layer according to an embodiment of the present invention, and FIG. 11 is a schematic diagram illustrating a second evaporation process for forming top electrodes according to an embodiment of the present invention. As shown in FIGS. 9-10, a first evaporation process is performed to form the organic luminescent layer 48. The first evaporation process includes the following steps. First, the substrate 30 having the partitions 48 formed thereon may be loaded into an evaporation chamber 70. In the evaporation chamber 70, an organic source 72 is disposed underneath the substrate 30. A first distance between the organic source 72 and the substrate 30 is substantially between 50 and 150 centimeters, but not limited thereto. In the first evaporation process, the organic source 72 is evaporated with a first tilt angle θ1 while the substrate 30 is rotated. The first tilt angle θ1 is between, for example, 20 and 45 degrees, but not limited thereto. By virtue of the partitions 46, and performing the first evaporation process with the first tilt angle θ1, a plurality of organic luminescent patterns 48a can be spontaneously formed and may be with only a fine-metal-mask process. As shown in FIGS. 9 and 11, a second evaporation process is performed to form the top electrodes. The second evaporation process includes the following steps. First, the substrate 30 having the organic luminescent patterns 48a formed thereon is loaded into an evaporation chamber 80. In the evaporation chamber 80, a metal source 82 is disposed underneath the substrate 30. A second distance between the metal source 82 and the substrate 30 is substantially between 50 and 150 centimeters, but not limited thereto. In the second evaporation process, the metal source 82 is evaporated with a second tilt angle θ2 while the substrate 30 is rotated. The second tilt angle θ2 is between, for example, 30 and 75 degrees, but not limited thereto. By virtue of the partitions 46, and performing the second evaporation process with the second tilt angle θ2, a plurality of top electrodes (cathodes 50a) can be spontaneously formed without requiring extra patterning process (fine-metal-mask process, for example). It is to be noted that by modifying the first distance, the second distance, the first tilt angle θ1, the second tile angle θ2, the rotation rate of the substrate 30 in the first evaporation process and that in the second evaporation process, the relative location between the organic source 72 and the substrate 30, and the relative location between the metal source 82 and the substrate 30 individually, the position of the cathodes 50 and the position of the luminescent patterns 48a can be controlled respectively such that each of the cathode 50 can extend beyond the corresponding luminescent pattern 48 to electrically connect to the exposed drain electrode 36a or electrically connect to the exposed anode in the series-connected region 42b.

Figure 12:
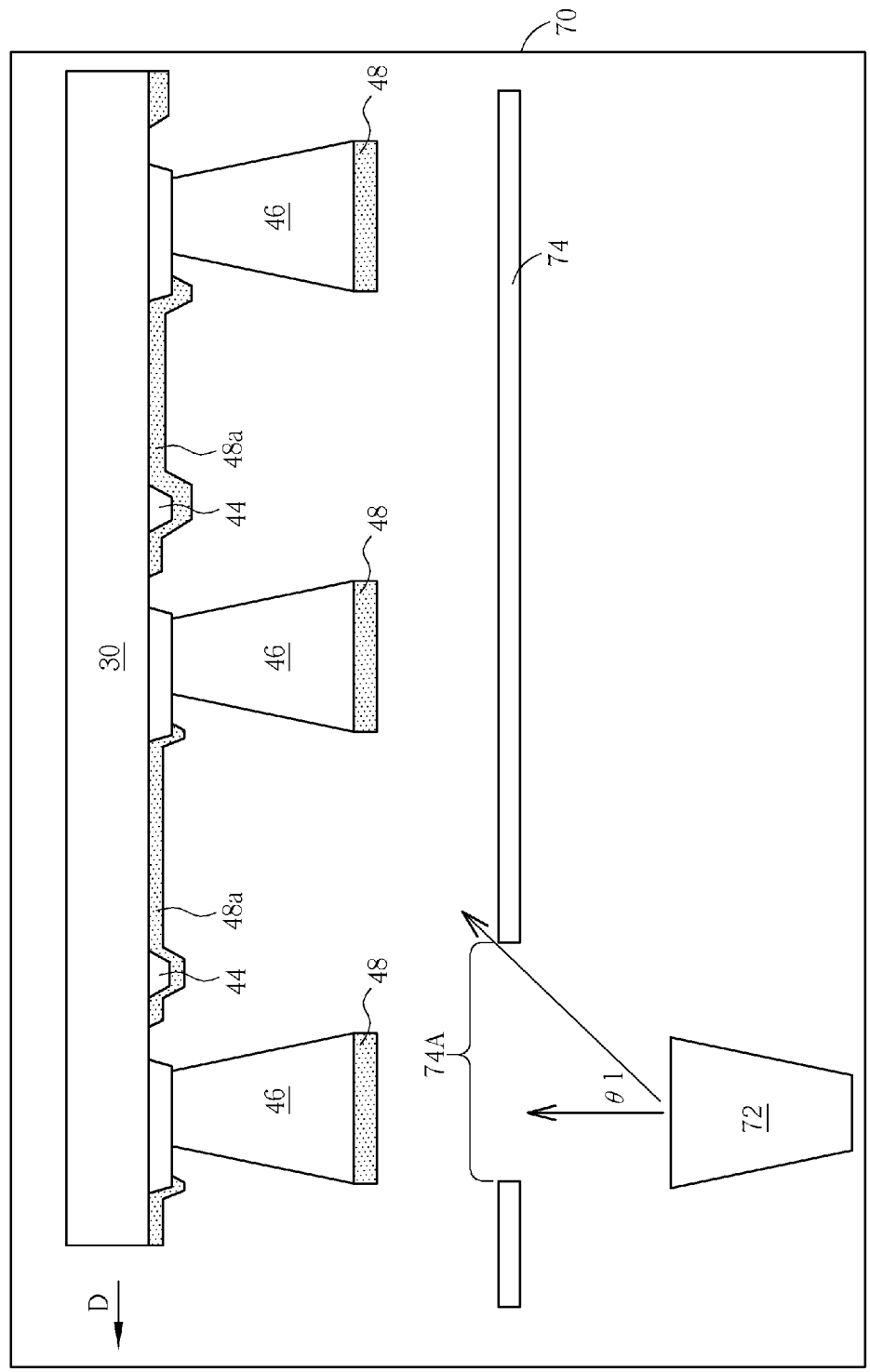
FIG. 12 is a schematic diagram illustrating a first evaporation process for forming an organic luminescent layer according to another embodiment of the present invention.
Figure 13:
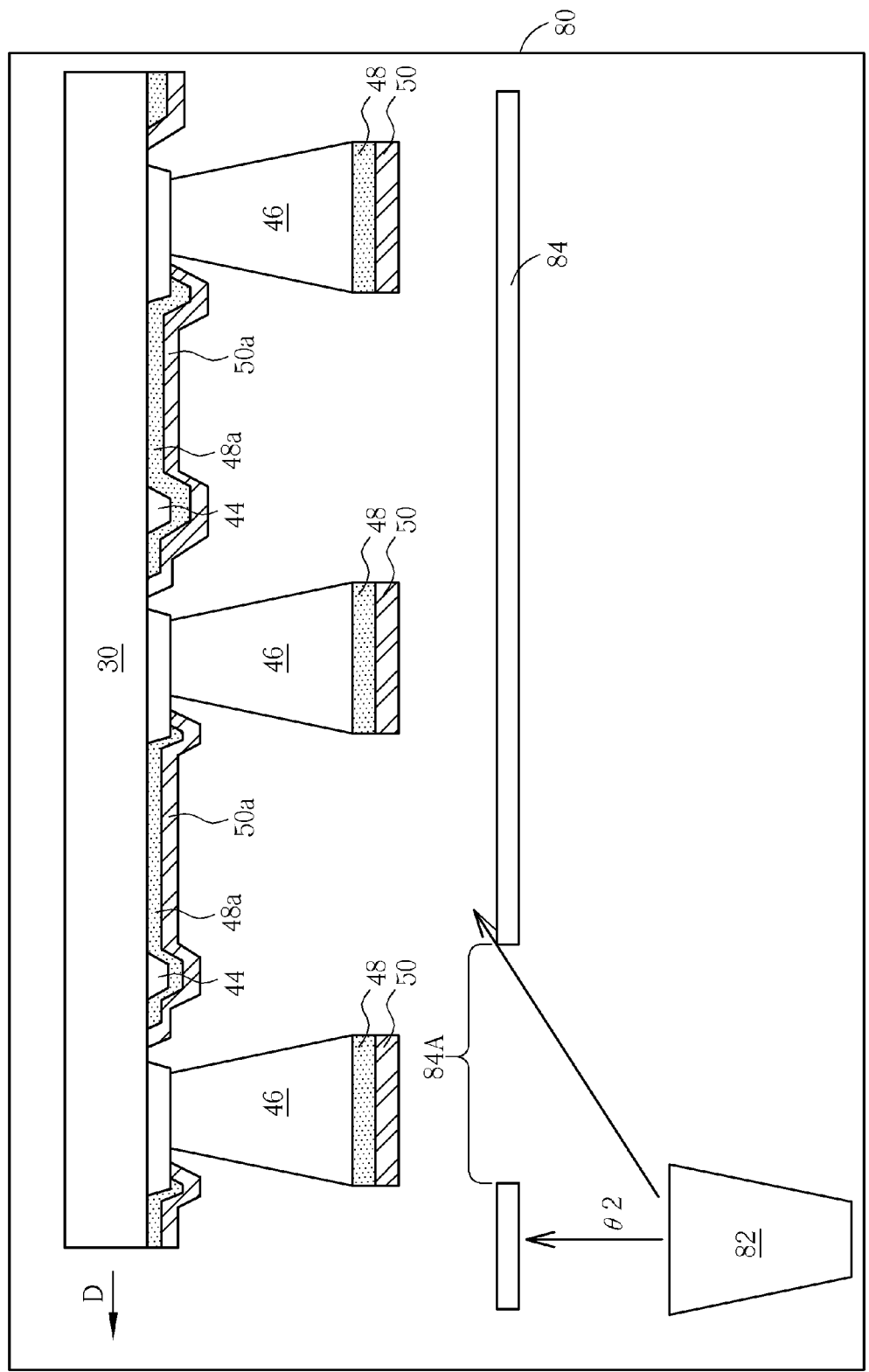
FIG. 13 is a schematic diagram illustrating a second evaporation process for forming top electrodes according to another embodiment of the present invention.

Please refer to FIG. 12 and FIG. 13 along with FIG. 9. FIG. 12 is a schematic diagram illustrating a first evaporation process for forming an organic luminescent layer according to another embodiment of the present invention, and FIG. 13 is a schematic diagram illustrating a second evaporation process for forming top electrodes according to another embodiment of the present invention. As shown in FIGS. 9 and 12, in this embodiment, a first shutter 74 having a first opening 74A is disposed between the substrate 30 and the organic source 72. The substrate 30 is moving along the direction D while the first shutter 74 and the organic source 72 remain fixed. By virtue of the partitions 46, and performing the first evaporation process with the first tilt angle θ1 using the first shutter 74, a plurality of organic luminescent patterns 48a can be spontaneously formed and may be with only a fine-metal-mask process. As shown in FIGS. 9 and 13, in this embodiment, a second shutter 84 having a second opening 84A is disposed between the substrate 30 and the metal source 82. The substrate 30 is moving along the direction D while the second shutter 84 and the metal source 82 remain fixed. By virtue of the partitions 46, and performing the second evaporation process with the second tilt angle θ2 using the second shutter 84, a plurality of top electrodes (cathodes 50a) can be spontaneously formed without requiring extra patterning process (fine-metal-mask process, for example). It is to be noted that by modifying the first distance, the second distance, the first tilt angle θ1, the second tile angle θ2, the size of the first opening 74A of the first shutter 74, the size of the second opening 84A of the second shutter 84, the moving rate of the substrate 30 in the first evaporation process and that in the second evaporation process, the relative location between the organic source 72 and the first opening 74A, and the relative location between the metal source 82 and the second opening 84A individually, the position of the cathodes 50 and the position of the luminescent patterns 48a can be controlled respectively such that each of the cathode 50 can extend beyond the corresponding luminescent pattern 48 to electrically connect to the exposed drain electrode 36a or electrically connect to the exposed anode in the series-connected region 42b.

In summary, each of the pixel regions of the pixel structure of the organic electroluminescent display panel of the present invention has a plurality of organic luminescent devices in series. The organic luminescent devices are located between the source electrode of the thin film transistor and the voltage source Vdd, so as to have advantages of low current and high stability. In addition, each of the anodes has a series-connected region. Combined with the disposition of the partitions, the method of the present invention disposes the organic luminescent devices between the source electrode of the thin film transistor and the voltage source Vdd and connects them in series without changing the process of the normal-type luminescent device. Therefore, the present invention can be applied to a TFT substrate in an a-Si process, and has great development potential for reducing complexity and increasing panel size.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure of an organic electroluminescent display panel, comprising:
   a substrate having a thin film transistor region, a first luminescent device region, and a second luminescent device region;
   a thin film transistor disposed in the thin film transistor region of the substrate;
   a first passivation layer disposed on the substrate, the first passivation layer having an opening partially exposing the thin film transistor;
   a first bottom electrode disposed on the first passivation layer in the first luminescent device region;
   a second bottom electrode disposed on the first passivation layer in the second luminescent device region;
   a second passivation layer disposed on the first bottom electrode and the second bottom electrode so as to at least partially expose the first bottom electrode and the second bottom electrode, the exposed first bottom electrode having a first luminescent region and a first series-connected region, and the exposed second bottom electrode having a second luminescent region and a second series-connected region;
   a partition substantially disposed on the second passivation layer and substantially overlapped with at least one of the first series-connected region and the second series-connected region;
   a first organic luminescent layer disposed on the first bottom electrode, and a second organic luminescent layer disposed on the second bottom electrode in the second luminescent region;
   a first top electrode disposed on the first organic luminescent layer in the first luminescent region and disposed on a part of the first passivation layer in the thin film transistor region, and electrically connected to the thin film transistor through the opening of the first passivation layer; and
   a second top electrode disposed on the second organic luminescent layer in the second luminescent region and electrically connected to the first series-connected region.

2. The pixel structure of claim 1, wherein at least one of the first series-connected region and the second series-connected region is disposed under the partition.

3. The pixel structure of claim 1, wherein the first bottom electrode and the second bottom electrode are anodes, and the first top electrode and the second top electrode are cathodes.

4. The pixel structure of claim 1, wherein the second series-connected region is electrically connected to a voltage source Vdd.

5. The pixel structure of claim 1, wherein a vertical cross-sectional shape of the partition is trapezoidal, having an upside that is wider than a downside.

6. The pixel structure of claim 5, wherein the partition further has a top surface and an inclined side surface connected to the top surface, and the top surface and the inclined side surface form an included angle in a range of 40 degrees to 90 degrees.

7. The pixel structure of claim 1, wherein the first series-connected region is located between the first luminescent region and the second luminescent region.

8. The pixel structure of claim 1, wherein a width of the partition is in a range of 5 μm to 20 μm, and a height of the partition is in a range of 1 μm to 3 μm.

9. The pixel structure of claim 1, wherein the thin film transistor is an NMOS thin film transistor.

10. The pixel structure of claim 1, wherein a material of the first bottom electrode and the second bottom electrode comprises indium-tin oxide, indium-zinc oxide, aluminum-zinc oxide, or combinations thereof, and a material of the first top electrode and the second top electrode comprises aluminum, lithium, calcium, magnesium, barium, or combinations thereof.

11. A pixel structure of an organic electroluminescent display panel, comprising:
   a substrate having a thin film transistor region, a first luminescent device region, and a second luminescent device region;
   a thin film transistor disposed in the thin film transistor region of the substrate;
   a first passivation layer disposed on the substrate, the first passivation layer having an opening partially exposing the thin film transistor;
   a first bottom electrode disposed on the first passivation layer in the first luminescent device region;
   a second bottom electrode disposed on the first passivation layer in the second luminescent device region;
   a second passivation layer disposed on the first bottom electrode and the second bottom electrode so as to at least partially expose the first bottom electrode and the second bottom electrode, the exposed first bottom electrode having a first luminescent region and a first series-connected region, and the exposed second bottom electrode having a second luminescent region and a second series-connected region;
   a partition substantially disposed on the second passivation layer and substantially overlapped with at least one of the first series-connected region and the second series-connected region;
   a first organic luminescent layer disposed on the first bottom electrode, and a second organic luminescent layer disposed on the second bottom electrode in the second luminescent region, wherein a portion of the first organic luminescent layer is substantially within the opening of the first passivation layer;
   a first top electrode disposed on the first organic luminescent layer in the first luminescent region and disposed on a part of the first passivation layer in the thin film transistor region, and electrically connected to the thin film transistor through the opening of the first passivation layer; and a second top electrode disposed on the second organic luminescent layer in the second luminescent region and electrically connected to the first series-connected region.

12. The pixel structure of claim 11, wherein at least one of the first series-connected region and the second series-connected region is disposed under the partition.

13. The pixel structure of claim 11, wherein the first bottom electrode and the second bottom electrode comprise anodes, and the first top electrode and the second top electrode comprise cathode.

14. The pixel structure of claim 11, wherein the second series-connected region is electrically connected to a voltage source Vdd.

15. The pixel structure of claim 11, wherein a vertical cross-sectional shape of the partition is trapezoidal, having an upside that is wider than a downside.

16. The pixel structure of claim 15, wherein the partition further has a top surface and an inclined side surface connected to the top surface, and the top surface and the inclined side surface form an included angle in a range of 40 degrees to 90 degrees.

17. The pixel structure of claim 11, wherein the first series-connected region is located between the first luminescent region and the second luminescent region.

18. The pixel structure of claim 11, wherein a width of the partition is in a range of 5 μm to 20 μm, and a height of the partition is in a range of 1 μm to 3 μm.

19. The pixel structure of claim 11, wherein the thin film transistor is an NMOS thin film transistor.

20. The pixel structure of claim 11, wherein a material of the first bottom electrode and the second bottom electrode comprises indium-tin oxide, indium-zinc oxide, aluminum-zinc oxide, or combinations thereof, and a material of the first top electrode and the second top electrode comprises aluminum, lithium, calcium, magnesium, barium, or combinations thereof.

21. A method of making an organic electroluminescent display panel, comprising:

providing a substrate having a plurality of pixel regions and a plurality of thin film transistors respectively disposed in each of the pixel regions;

forming a first passivation layer on the substrate corresponding to each of the thin film transistors, the first passivation having an opening exposing at least part of each of the thin film transistors;

forming a plurality of bottom electrodes in each of the pixel regions;

forming a second passivation layer on the first passivation layer and the bottom electrodes, wherein the second passivation at least partially exposes each of the bottom electrodes to form a luminescent region and a series-connected region on each of the bottom electrodes;

forming a plurality of partitions on the second passivation layer for dividing each of the pixel regions into a plurality of sub-pixel regions, wherein each of the bottom electrodes is located in each of the corresponding sub-pixel regions, each of the partitions has a top surface, and each of the partitions substantially overlaps with one of the series-connected regions;

performing a first evaporation process to form an organic luminescent layer on the bottom electrodes and on all the top surface of each partition to form a plurality of organic luminescent patterns isolated from each other on the anodes through the partitions, each of the organic luminescent patterns respectively corresponding to each of the bottom electrodes, wherein a portion of each of the organic luminescent patterns is substantially within the opening of the first passivation; and performing a second evaporation process to form a plurality of top electrodes on the organic luminescent layer corresponding to each of the organic luminescent patterns, the top electrodes being isolated from each other on the organic luminescent patterns through the partitions to form a plurality of organic luminescent devices, wherein in each of the pixel regions, the top electrode in one of the sub-pixel regions is in contact with the series-connected region of the adjacent bottom electrode, and the top electrode in another sub-pixel region is in contact with the adjacent thin film transistor to connect the organic luminescent devices in each of the sub-pixel regions to the thin film transistor in series.

22. The method of claim 21, wherein a vertical cross-sectional shape of each of the partitions is trapezoidal with an upside that is wider than a downside.

23. The method of claim 21, wherein each of the partitions further has an inclined side surface connected to the top surface, and the top surface and the inclined side surface form an included angle in a range of 40 degrees to 90 degrees.

24. The method of claim 21, wherein each of the bottom electrodes comprises an anodes, and each of the top electrodes comprises a cathode.

25. The method of claim 21, wherein the first evaporation process comprises evaporating an organic source to form the organic luminescent layer with a first tilt angle, the second evaporation process comprises evaporating a metal source to form the top electrodes with a second tilt angle, and the first tilt angle is less than the second tilt angle.

26. The method of claim 25, wherein the first tilt angle is substantially between 20 and 45 degrees, and the second tilt angle is substantially between 30 and 75 degrees.

27. The method of claim 25, wherein a first shutter having a first opening is disposed between the substrate and the organic source in the first evaporation process, and a second shutter having a second opening is disposed between the substrate and the metal source in the second evaporation process.

28. A pixel structure of an organic electroluminescent display panel, comprising:

a substrate having a thin film transistor region, a first luminescent device region, and a second luminescent device region;

a thin film transistor substantially disposed in the thin film transistor region of the substrate;

a first passivation layer disposed on the substrate, the first passivation layer having an opening partially exposing the thin film transistor;

a first bottom electrode disposed on the first passivation layer in the first luminescent device region;

a second bottom electrode disposed on the first passivation layer in the second luminescent device region;

a second passivation layer disposed on the first bottom electrode and the second bottom electrode so as to at least partially expose the first bottom electrode and the second bottom electrode, the exposed first bottom electrode having a first luminescent region and a first series-connected region, and the exposed second bottom electrode having a second luminescent region and a second series-connected region;

a partition substantially disposed on the second passivation layer and at least overlapped with a portion of the thin film transistor;

a first organic luminescent layer disposed on the first bottom electrode, and a second organic luminescent layer disposed on the second bottom electrode in the second luminescent region;

a first top electrode disposed on the first the organic luminescent layer in the first luminescent region and disposed on a part of the first passivation layer in the thin film transistor region, and electrically connected to the thin film transistor through the opening of the first passivation layer; and a second top electrode disposed on the second organic luminescent layer in the second luminescent region and electrically connected to the first bottom electrode under the partition.

* * * * *